United States Patent [19]

Stuart et al.

[11] 3,946,214
[45] Mar. 23, 1976

[54] MULTI-LEVEL DIGITAL FILTER

[75] Inventors: Richard L. Stuart, Simpsonville; Arvind M. Bhopale, Beltsville, both of Md.

[73] Assignee: Rixon, Incorporated, Silver Spring, Md.

[22] Filed: Sept. 17, 1974

[21] Appl. No.: 506,833

Related U.S. Application Data

[63] Continuation-in-part of Ser. No. 269,048, July 5, 1972, Pat. No. 3,883,727.

[52] U.S. Cl. ................. 235/152; 333/18; 333/28 R
[51] Int. Cl.² .......................................... G06F 15/34
[58] Field of Search ................... 235/152, 156, 164; 328/162, 163; 333/18, 28, 70 T

[56] References Cited
UNITED STATES PATENTS

| | | | |
|---|---|---|---|
| 3,629,509 | 12/1971 | Glaser | 235/152 X |
| 3,638,122 | 1/1972 | Gibson | 333/18 X |
| 3,651,316 | 3/1972 | Gibson | 235/152 |
| 3,665,171 | 5/1972 | Morrow | 235/152 |
| 3,699,321 | 10/1972 | Gibson | 235/152 |
| 3,775,688 | 11/1973 | Hinoshita et al. | 333/18 X |

*Primary Examiner*—Charles E. Atkinson
*Assistant Examiner*—Jerry Smith
*Attorney, Agent, or Firm*—Larson, Taylor and Hinds

[57] ABSTRACT

A multi-level digital filter system applicable to modems is provided. The incoming data is read serially into M shift registers and read out in parallel by M further shift registers under the control of an M-bit clock, where $M = \log_2 N$ and N is the number of levels. After appropriate conditioning by a logic control circuit, the parallel outputs are filtered separately by M digital shaping filters. The shaping filters each comprise a chain of shift registers the outputs of which are weighted by a resistor network and summed to produce a desired time response, which in an exemplary embodiment is the inverse Fourier transform of an ideal low-pass filter. Summing of the filter outputs produces an N-level signal. Specific examples of three-, four-, five-, six- and eight-level systems are disclosed.

9 Claims, 16 Drawing Figures

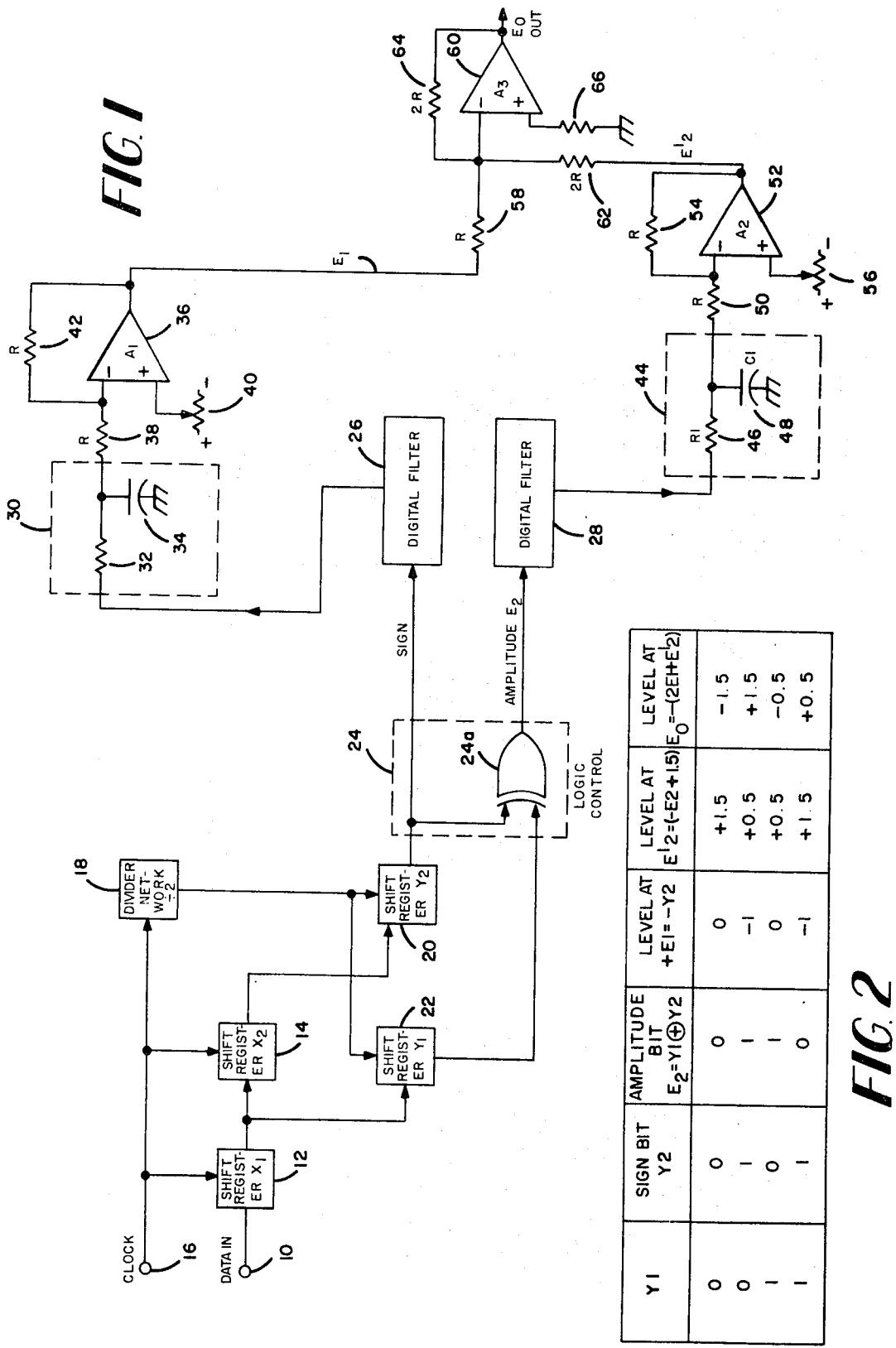

3,946,214

MULTI-LEVEL DIGITAL FILTER

CROSS-REFERENCE TO RELATED APPLICATIONS

This application is a continuation-in-part of U.S. application Ser. No. 269,048, filed July 5, 1972 and now U.S. Pat. No. 3,883,727.

FIELD OF THE INVENTION

The present invention relates to digital filters for data modems and the like, and more particularly, to digital filter systems for generating multilevel bandlimited signals.

BACKGROUND OF THE INVENTION

Single sideband and double sideband transmitters for data modems characteristically include a plurality of filters as well as other shaping and delay networks, for example, many conventional modems utilize a shaping filter, a vestigal sideband filter and a phase equalizer in the data transmitter. These circuits are expensive and relatively difficult to control insofar as producing a precise time response is concerned. Hence, given the increased emphasis on the reduction in the hardware required in data communication systems, any system which eliminates such circuits has obvious advantages as compared with the systems of the prior art.

SUMMARY OF THE INVENTION

In accordance with the present invention a multi-level digital filter system is provided which is applicable to data modems and which can be used in a single sideband or double sideband transmitter. The filter system can be used to eliminate the necessity of a shaping filter, VSB filter and phase equalizer, the filter providing a fixed delay and having no intersymbol interference at sampling points. The invention also involves techniques of generating band limited waveforms and enables the synthesizing of a preselected controlled time response.

According to a presently preferred embodiment of the invention, means are provided whereby the incoming data is read serially into clocl-controlled shift registers and is read out in parallel using an M-bit clock, where $M = \log_2 N$ and N is the number of levels. Logic controls convert the parallel outputs into a desired form and the resultant output bits are filtered separately by M, two-level input digital filters. It is noted that if M is a fraction, it is rounded to the next higher integer so that the number of possible levels is greater than desired, the logic control being designed so that only the desired levels are generated. The digital filters comprise an $n$-stage shift register having a common clock. The number of shift registers, $n$, is given by the expression $n = r(m-1) + 2$, where $r$ is the ratio of the clock rate to the data rate and $m$ is the equivalent number of pulses which can be accommodated with the period of the shaping function. The output of each shift-register is weighted by a resistor network and summed to produce a desired time response. In a specific embodiment this desired time response is the inverse Fourier transform of an ideal low-pass filter, the filter serving to delay, symmetrically truncate and shape the time response such that the frequency response produced is that of an ideal low-pass filter within specified error limits. The window function, $K_0 - K_1 \cos(\pi/T_1 \cdot t)$, is used for shaping a truncated $\sin x/x$ waveform, where $K_0$ and $K_1$ are constants having optimum values of 0.538 and 0.462, respectively. The outputs of the filters, after suitable smoothing, are summed to produce the N-level filtered analog signal.

The digital filter system of the invention can adapt to a change of data rate as long as the ratio of the data rate to filter clocking frequency is held constant.

Specific embodiments of 3-level, 4-level, 5-level, 6-level, and 8-level systems are discussed hereinbelow.

Other features and advantages of the invention will be set forth in or apparent from a detailed description of a preferred embodiment found hereinbelow.

BRIEF DESCRIPTION OF THE DRAWINGS

FIG. 1 is a schematic circuit diagram, largely in block form, of a four-level digital filter system in accordance with one embodiment of the invention.

FIG. 2 is a table indicating the values at various points in the circuit of FIG. 1;

DESCRIPTION OF THE PREFERRED EMBODIMENTS

Figure 3:
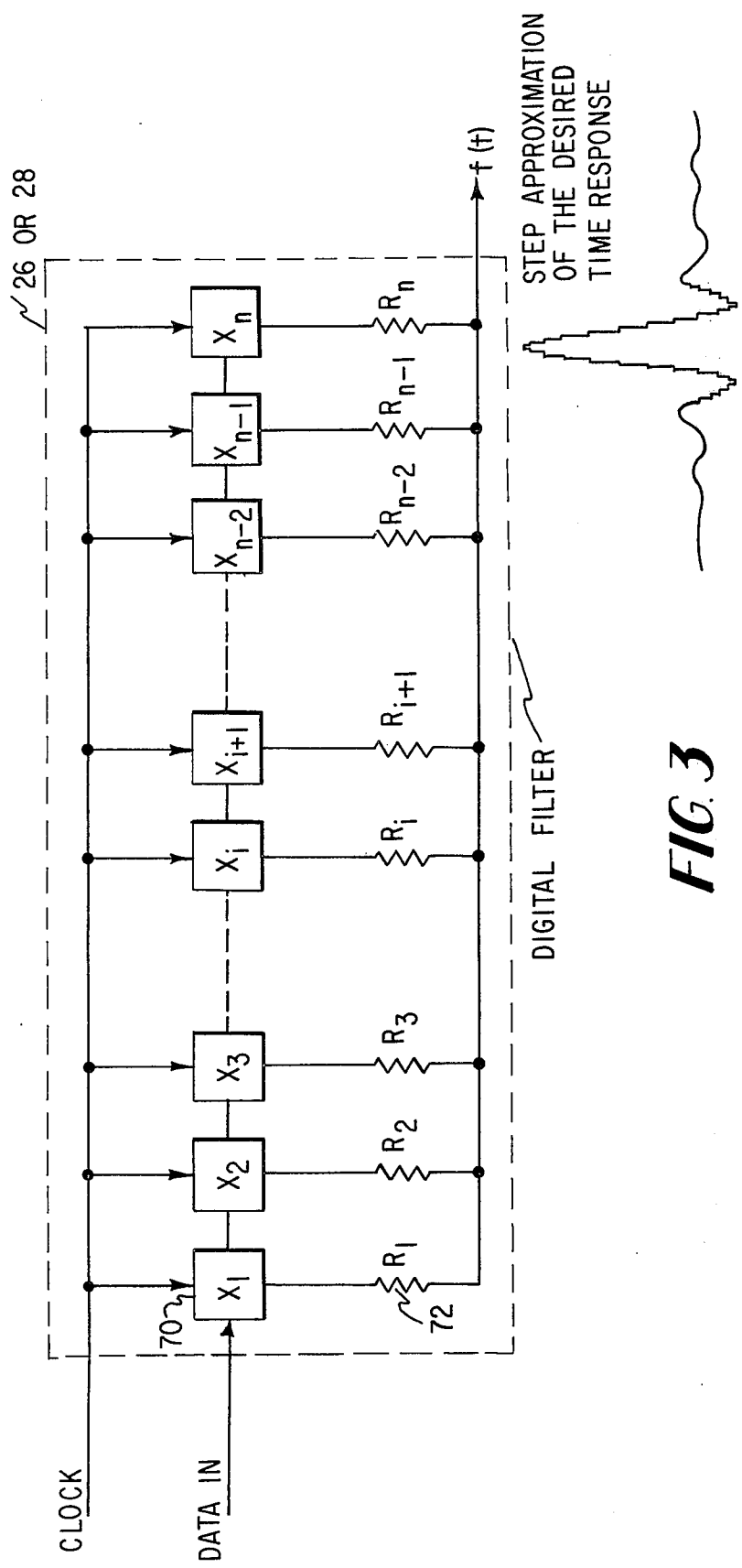
FIG. 3 is a schematic circuit diagram of the digital shaping filters of FIG. 1.

As mentioned hereinabove, the present invention is applicable to N-level systems and, in fact, a generalized N-level system is considered hereinbelow. However, it is thought that the present invention can be perhaps best understood by considering a number of concrete examples before considering the generalized N-level system. Hence, a four-level system, which is shown in FIG. 1, will be investigated first.

Referring to FIG. 1, a data input indicated at 10 is read serially into first and second shift registers 12 and 14, the output of register 12 forming an input of register 14. The clock inputs of registers 12 and 14 are connected to a clock, indicated at 16, which is divided in a divider network 18 to produce a dibit clock. The outputs of registers 12 and 14 are connected to registers 20 and 22, respectively. The clock inputs of registers 20 and 22 are connected to the output of divider network 18 so that the data input is read out in parallel under the control of the dibit clock.

One parallel output bit is used to control the sign of the resulting waveform whereas the other parallel output bit is used to control the amplitude. The output of register 20 corresponds to the sign bit in the example under consideration whereas the amplitude bit is derived in a manner described hereinafter. As illustrated, shift registers 20 and 22 are connected to a logic control network 24 indicated in dashed lines. As mentioned above and as shown in FIG. 1, the output of register 20 forms a first, sign bit output of the logic control network 24. Network 24 includes an exclusive OR gate 24a which performs a Modulo-2 addition of the outputs of registers 20 and 22 to generate the second, amplitude bit output. The rules for Modulo-2 addition are familiar to those skilled in the art and the truth table of FIG. 2 illustrates the relationship between the second, amplitude bit output, denoted E2, and the outputs of registers 20 and 22. The two outputs of logic network 24 are respectively connected to first and second digital filters 26 and 28 described hereinbelow.

The levels "0" and "1" at the input of first or sign bit digital filter 26 are equivalent to logical "0"s and "1"s respectively. As explained hereinbelow, digital filter 26 is used to produce a step approximation of the desired time response. In the specific application under consideration this response is the inverse Fourier transform of an ideal low-pass filter. The step output of sign bit digital filter 26 is smoothed by smoothing circuit 30 formed by a series resistor 32 and a shunt capacitor 34, and is buffered by an operational amplifier 36. The inverting input of amplifier 36 is connected to the output of smoothing circuit 30 through an input resistor 38 whereas the non-inverting input is connected to the tap of potentiometer 40 to provide a predetermined reference voltage. A feedback resistor 42, of a value equal to that of input resistor 38, is connected between the output of amplifier 36 and the inverting input thereof. The output of operational amplifier 36 is denoted E1 in FIG. 1 and, as is shown in the truth table of FIG. 2, is equal to minus the output voltage of the digital filter 26.

Digital filter 28 is similar to digital filter 26 and produces a step output which is an approximation of the desired time response and which is processed by a smoothing filter 44 formed by a series resistor 46 and a shunt capacitor 48. The smoothed analog output of filter 44 is connected through an input resistor 50 to the inverting input of an operational amplifier 52. An equal-valued feedback resistor 54 is connected between the output of amplifier 52 and the inverting input thereof as shown, the non-inverting input of amplifier 52 being connected to a further potentiometer 56. The output of amplifier 52 is denoted E'2 as is indicated in FIG. 1 and, as shown in the truth table of FIG. 2, is equal to minus the output voltage of the digital filter 28, plus a fixed 1.5 volt bias or reference voltage provided at the tap of potentiometer 56.

The output, E1, of amplifier 36 is connected through a resistor 58 to the inverting input of an operational amplifier 60 whereas the output, E'2, of amplifier 52 is connected to the same input through a second resistor 62. The value of resistor 62 is twice that of resistor 58 and equal to that of feedback resistor 64. The non-inverting input of amplifier 60 is connected to ground through a further resistor 66 and the output thereof, denoted $E_0$, is the desired multilevel signal as indicated in the table of FIG. 2.

Referring to FIG. 3, the make-up of the digital filters 26 and 28 of FIG. 2 is shown. Filters 26 and 28 basically comprise a multi-state shift register, generally denoted 70, the shift-registers of the individual stages having a common clock as indicated. FIG. 3 shows a generalized, exemplary $n$-stage shift-register made up of individual registers $X1, X2, \ldots Xi, Xi+1, \ldots Xn-1, Xn$. The output of each shift-register is weighted by a corresponding resistor $R1$ and $Rn$ which forms part of a resistor ladder network generally denoted 72, these outputs being summed together to produce a step approximation of the desire time response. As mentioned hereinabove, in the specific application under consideration the desired time response is the inverse Fourier transform of an ideal low-pass filter. The digital filters 26 and 28 serve to delay, symmetrically truncate and shape this response such that the frequency response thereof approaches that of an ideal low-pass filter within specified error limits. The shaping or window function utilized is of the general form $K_0 - K_1 \cos(\pi t / T1)$ where $K0$ and $K1$ are constants having optimum values of 0.538 and 0.462 respectively, and the function exists for the truncated period $t = 0$ to $2T_1$. The resulting waveform for a single input pulse is symmetrical about the point $t = T_1$ with equally spaced zero crossings. The spacing between two successive zero crossings is the same as the width of a single input pulse, which is the reciprocal of the input data rate. The clock rate is decided by the number of samples in a single input pulse. The ratio of the clock rate to the data rate is 8 in the present instance although this ratio can be any integer greater than 2. The number of shift registers, $n$, is given by the expression $n = r(m-1) + 2$ wherein $r$ is the ratio of the clock rate to data rate and $m$ is the equivalent number of pulses which can be accommodated within the period $t = 0$ to $2T_1$.

Figure 16:
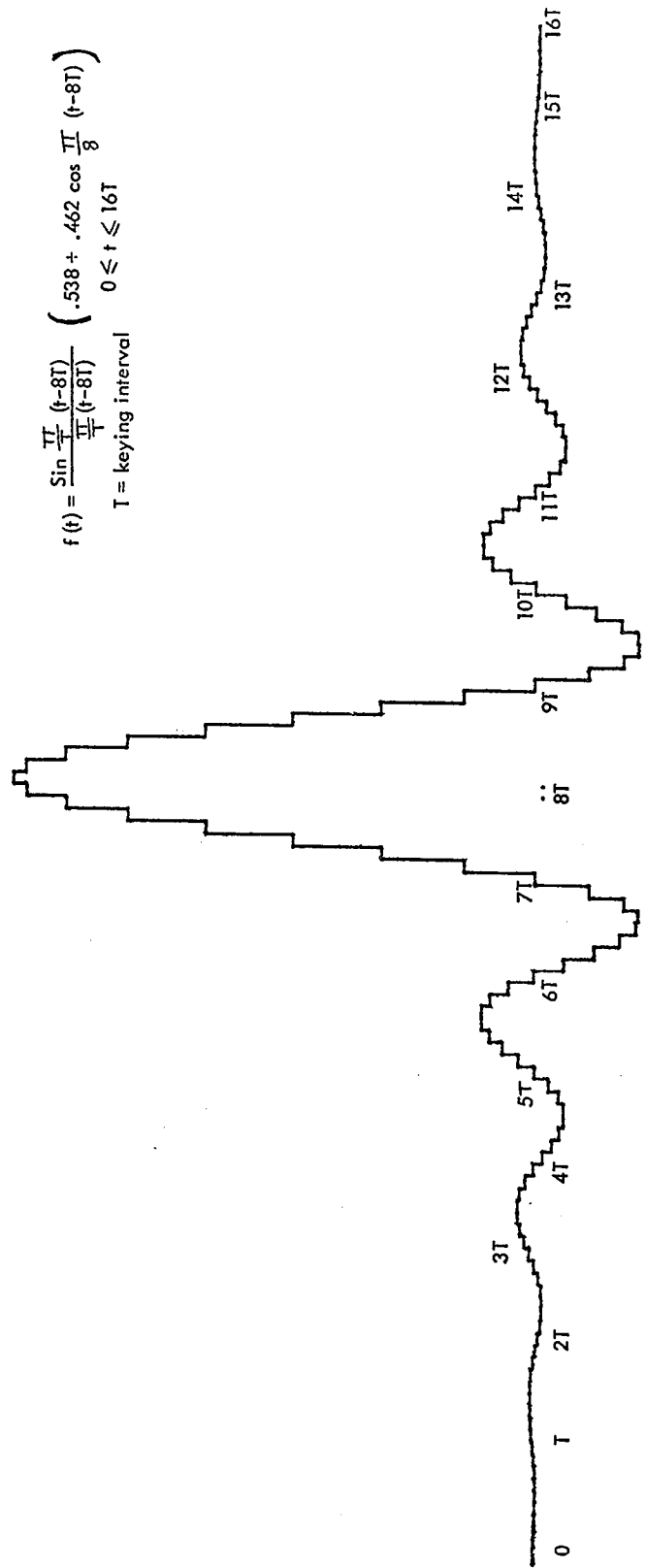
FIG. 16 is a voltage-time diagram of the output of the digital filter of FIG. 3.

The values of the individual resistors $R_1$ to $R_n$ referred to above is given by the following equations:

$$C_1 = 0$$

$$C_I + 1 = S_{I+1} - S_I \qquad \text{for } I = 1 \text{ to } r$$

$$C_J = S_J - \sum_{I=K}^{K+r-2} C_I \qquad \begin{array}{l}\text{for } J = r+2 \text{ to } N/2+1 \text{ and} \\ K = 3 \text{ to } N/2-r-1\end{array}$$

$$C_I = \left(\frac{C_I \pm C_K}{2} - J + 3\right) / 2 \qquad \begin{array}{l}\text{for } I = N/2-r+2 \text{ to } N-r/2+1 \text{ and} \\ J = 1 \text{ to } I - N/2 + r\end{array}$$

where $S_1, S_2, S_3, \ldots, S_N$ are the sampled values of the desired time response and $C_1, C_2, C_3, \ldots, C_n$ are the coefficient values. The sign in the last expression is positive for even functions and and negative of odd functions. The resistor values, $R_i$'s, are inversely proportional to the coefficients $C_i$ and are given by the expression $R_i = 1/C_i = \pm R(N-r-i+3)$, for $i = 1$ to $n/2$. The sign in this expression is positive for even functions and negative for odd functions. For $N = 128$, $m = 16$, and $r = 8$ the resistor values are shown in the table set forth at the end of the specification. These values produce the step approximated pulse response shown in FIG. 16.

The same technique is followed in determining the resistor values used in generating an equivalent Hilbert transform which is equally delayed, symmetrically truncated and shaped.

Figure 4:
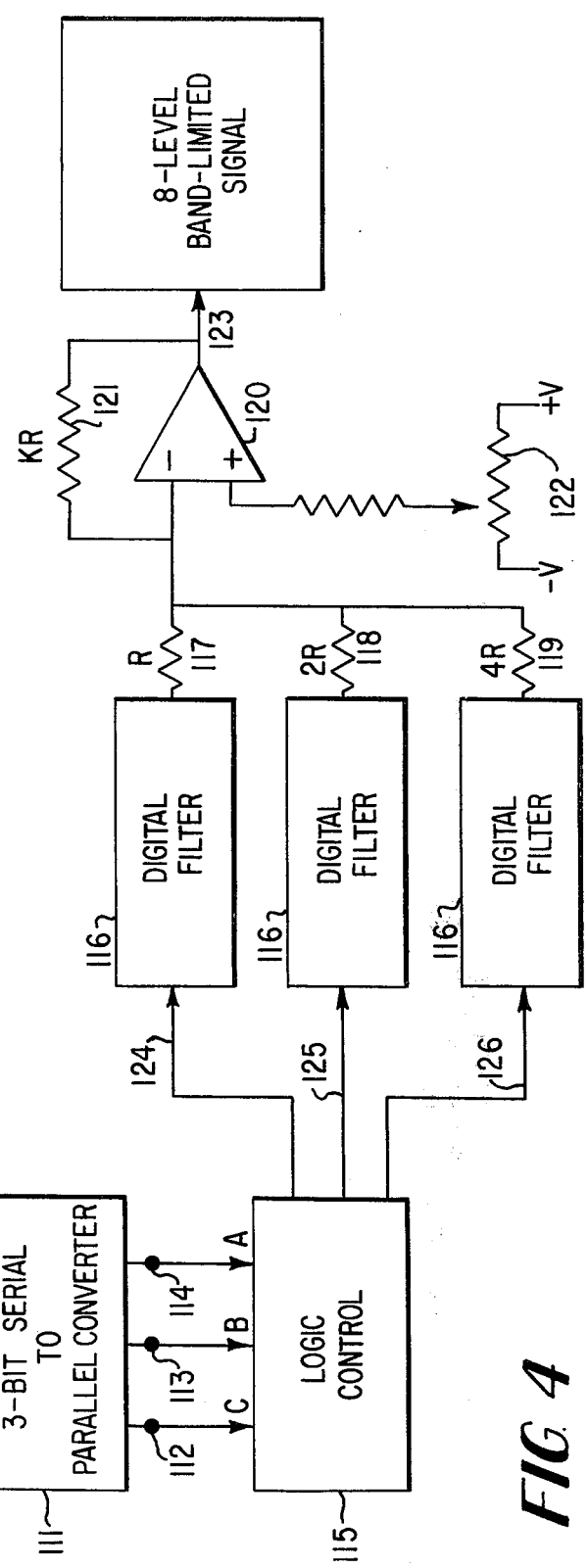
FIG. 4 is a schematic circuit diagram largely in block form, of an eight-level digital filter system.

Referring to FIG. 4, an eight-level digital filter is shown. Serial data is read into a 3 bit serial to parallel converter 111 through input 110. The outputs from the converter 111 which appear at terminals 112, 113, and 114 are 3 bit words that are clocked out at one-third the data input rate. A detailed description of converter 111 is given below. The 3 bit words from converter 111 form the input to logic control circuit 115. In order to provide eight discrete levels, only 3 binary bits are needed, i.e., there is exact one to one correspondence between the possible input permutations and the desired output levels as is shown by the following listing:

| 3 bit binary word | level |
|---|---|
| 000 | 1 |
| 001 | 2 |
| 010 | 3 |
| 011 | 4 |
| 100 | 5 |
| 101 | 6 |
| 110 | 7 |
| 111 | 8 |

Figure 5:
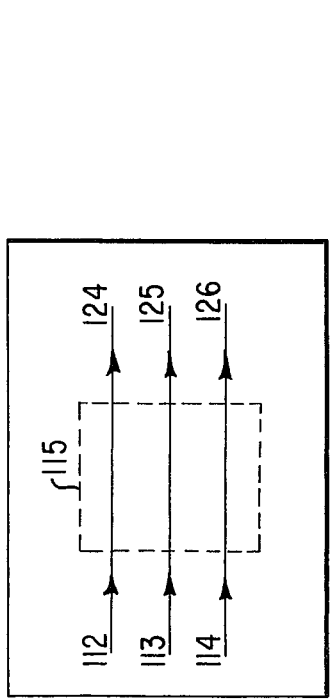
FIG. 5 is a schematic circuit diagram of the logic control circuit of FIG. 4.

Thus, in the 3 bit – 8 level transformation, no special conditioning is necessary. Thus, referring to FIG. 5, in this embodiment control logic circuit 115 merely consists of three direct, hard wired connections. More complex conditioning will be required in the 3, 5, and 6 level embodiments described below. While in this simple case, no conditioning is needed, if a different one-to-one correspondence between input words and output level were desired, control circuit 115 would include the appropriate gates to realize the Boolean equations for the desired coding. Again, an example of this approach is discussed below.

Returning to FIG. 4, the three output lines 124, 125 and 126 of logic control circuit 115 form the inputs for three digital filters 116. The digital filters 116 are used to provide a step approximation of a desired time response and the make-up of these circuits is described hereinabove. The step outputs from the digital filters 116 are applied to respective ones of three summing resistors 117, 118, and 119. Resistors 117, 118, and 119 have the values R, 2R, and 4R respectively so that an analog sum of the three digital filters 116 is presented at the inverting input of an operational amplifier 120. Operational amplifier 120 has a feedback resistor 121 with a value of $kR$ connected from its inverting input to its output 123. A reference potentiometer 122 provides a reference voltage to the non-inverting input of the operational amplifier 120. Output 123 from the operational amplifier 120 is the desired eight level signal with the time response of the three digital filters 116.

Figure 6:
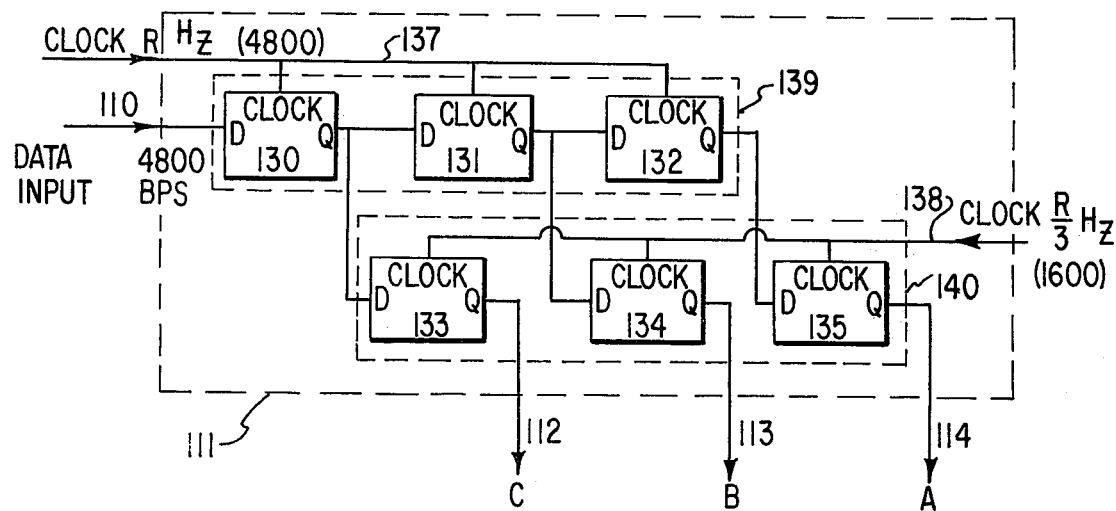
FIG. 6 is a schematic circuit diagram, largely in block form, of the series to parallel converter of FIG. 4.

Referring now to FIG. 6, there is shown an exemplary embodiment of a 3 bit serial to parallel converter corresponding to converter 111 of FIG. 4. The converter 111 includes a three bit shift register, denoted 139, which is comprised of three D-type flip-flops 130, 131 and 132 having a common clock provided by a clock input line 137. Input data appears at flip-flop 130 on an input line 110 at a rate R. The clock pulses on line 137 clock the shift register 139 at the same rate R so that as data appears at input 110, the data is shifted through the register 139 serially. Each 3 bit string that is presented at input 110 makes up one 3 bit word. A storage register 140 is comprised of three D-type flip-flops 133, 134, and 135 and is clocked at a rate of R/3 by a clock signal appearing on line 138. The result is that as each 3 bit word is shifted into flip-flops 130, 131, and 132, the word is stored in parallel by register 140 under the control of clock line 138. Thus, register 140 will contain the last complete 3 bit word to pass through the shift register 139. The outputs of the three storage flip-flops 133, 134, and 135 are denoted 112, 113, and 114 and form the inputs to control logic circuit 115 of FIG. 4.

The converter of FIG. 6 is expandable into an $n$-bit serial to parallel converter by setting the number of flip-flops in shift register 139 equal to $n$ and the number of flip-flops in storage register 140 equal to $n$, and providing clocking pulses on the storage clock line 138 at a rate of $R/n$.

Figure 7:
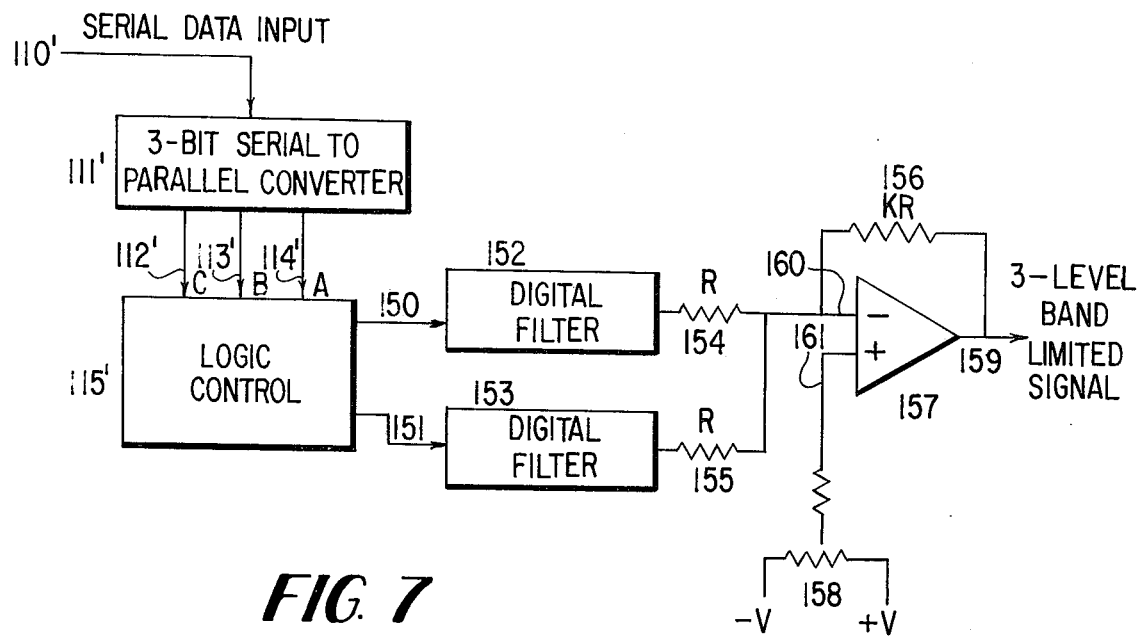
FIG. 7 is a schematic circuit diagram, largely in block form, of a three-level digital filter.

Referring to FIG. 7, an exemplary three-level digital filter is shown. In this case, to provide three discrete levels, only 2 binary bits are needed. So as to make comparison to the previously discussed eight-level filter more apparent, a 3 bit binary word will be used in the three-level filter rather than a 2 bit word. These 3 binary bits will determine eight discrete levels. However, nine discrete levels are needed to provide two three-level signals. Thus, it has been arbitrarily chosen to make one of the nine possible pairs of three-level signals "illegal" so as to allow two three-level signals to be determined by the three binary bits. A conversion table follows:

| INPUT 3 bit binary word ABC | OUTPUT 1st 3 level signal | 2nd 3 level signal |
|---|---|---|
| 000 | 0 | 0 |
| 001 | 2 | 1 |
| 010 | 0 | 1 |
| 011 | 0 | 2 |
| 100 | 1 | 0 |
| 101 | 2 | 2 |
| 110 | 1 | 1 |
| 111 | 1 | 2 |
| (Not allowed | 2 | 0) |

This conversion table is only an example of possible desired outputs from the 3 bit word input. As an extreme example, it is possible to have the three binary bits determine a single three-level signal and "waste" the other five possible outputs:

| 3 bit binary input | 3 level signal output |
|---|---|
| 000 | 0 |
| 001 | 1 |
| 010 | 2 |
| 011 | No output |
| 100 | No output |

-continued

| 3 bit binary input | 3 level signal output |
|---|---|
| 101 | No output |
| 110 | No output |
| 111 | No output |

Thus, the selection of the length of the binary word input, the number of levels of output and, the number of N-level output signals that result from the chosen binary bit word, are all arbitrary. It is the function of the logic control circuit 15' to convert the selected binary bit word into corresponding N-level signals. Continuing with the example of three binary bits into two three-level signals:

| 1st 3 level signal | 2nd 3 level signal | D' | E' | $D_1E_1$ | $D_2E_2$ |
|---|---|---|---|---|---|
| 0 | 0 | 2 | 2 | 1 1 | 1 1 |
| 2 | 1 | 0 | 1 | 0 0 | 0 1 |
| 0 | 1 | 2 | 1 | 1 1 | 0 1 |
| 0 | 2 | 2 | 0 | 1 1 | 0 0 |
| 1 | 0 | 1 | 2 | 0 1 | 1 1 |
| 2 | 2 | 0 | 0 | 0 0 | 0 0 |
| 1 | 1 | 1 | 1 | 0 1 | 0 1 |
| 1 | 2 | 1 | 0 | 0 1 | 0 0 |
| 2 | 0 | Not allowed | | | |

$2 \to 0$, $1 \to 1$, $0 \to 2$ | $0 \to 00$, $1 \to 01$, $2 \to 11$

The Boolean equations that represent logical definitions of $D_1, E_1, D_2, E_2$ in terms of the three binary inputs A, B, and C are:

$$D_1 = \overline{(A \cdot C)} + \overline{(A \cdot B)} \quad E_1 = \underline{B + \overline{C}}$$
$$D_2 = B \cdot \overline{C} \quad E_2 = B \cdot \overline{A} + C$$

The 2 bit pair of $D_1E_1$ represents the first three-level signal and the 2 bit pair $D_2E_2$ represents the second three-level signal. The output two bit pair, denoted $F_1F_2$, must alternate between $D_1E_1$ and $D_2E_2$. A clock signal CL is used to alternately select which of the two two-bit pairs is to appear as output pair $F_1F_2$. The resulting Boolean equations for $F_1$ and $F_2$ are:

$$F_1 = \overline{D_1CL} + \overline{D_2\overline{CL}}$$

$$F_2 = \overline{E_1CL} + \overline{E_2\overline{CL}}$$

Figure 8:
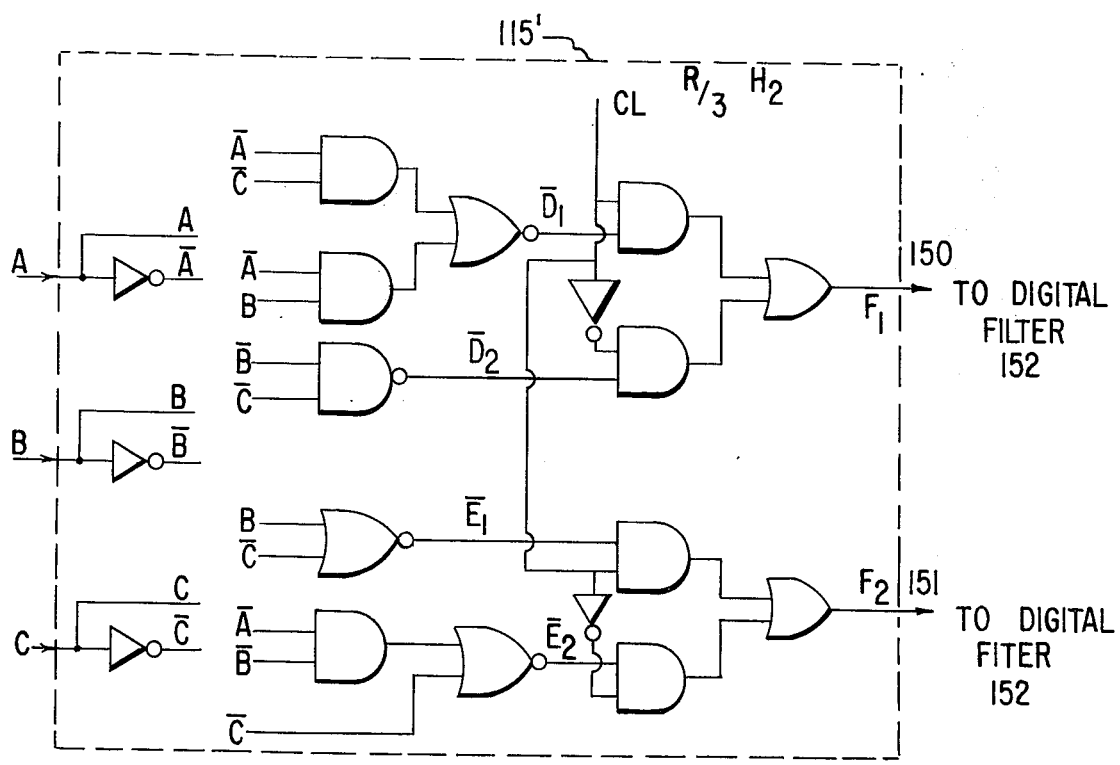
FIG. 8 is a schematic circuit diagram, largely in block form, of the control logic of FIG. 7.

Referring to FIG. 8, a logic control circuit 115' is shown that will perform the desired three bit binary into $F_1F_2$ output conversion. All of the gates shown in FIG. 8 are conventional AND, NAND, OR, NOR, and INVERT gates. The method of operation of the circuit shown in FIG. 8 so as to realize the Boolean equations set forth above will be readily evident to those skilled in the art and hence a detailed description of FIG. 8 is deemed unnecessary and will be dispensed with. The output signals appearing on output lines 150 and 151 of logic control circuit 115' are three-level signals which are then transferred into a desired time response by first and second digital filters 152 and 153 of FIG. 7.

Again referring to FIG. 7, the outputs from digital filters 152, 153 pass through respective summing resistors 154 and 155 to the inverting input 160 of operational amplifier 157, summing resistors 154 and 155 each having the value R. A feedback resistor of $k$R ohms is provided between the output 159 of operational amplifier 157 and the inverting input 160. A potentiometer 158 is connected to the non-inverting input 161 of operational amplifier 157 to provide a voltage reference. The output signal at output 159 provides two three-level band limited signals for each three bit binary word that appears on input line 110'.

Figure 9:
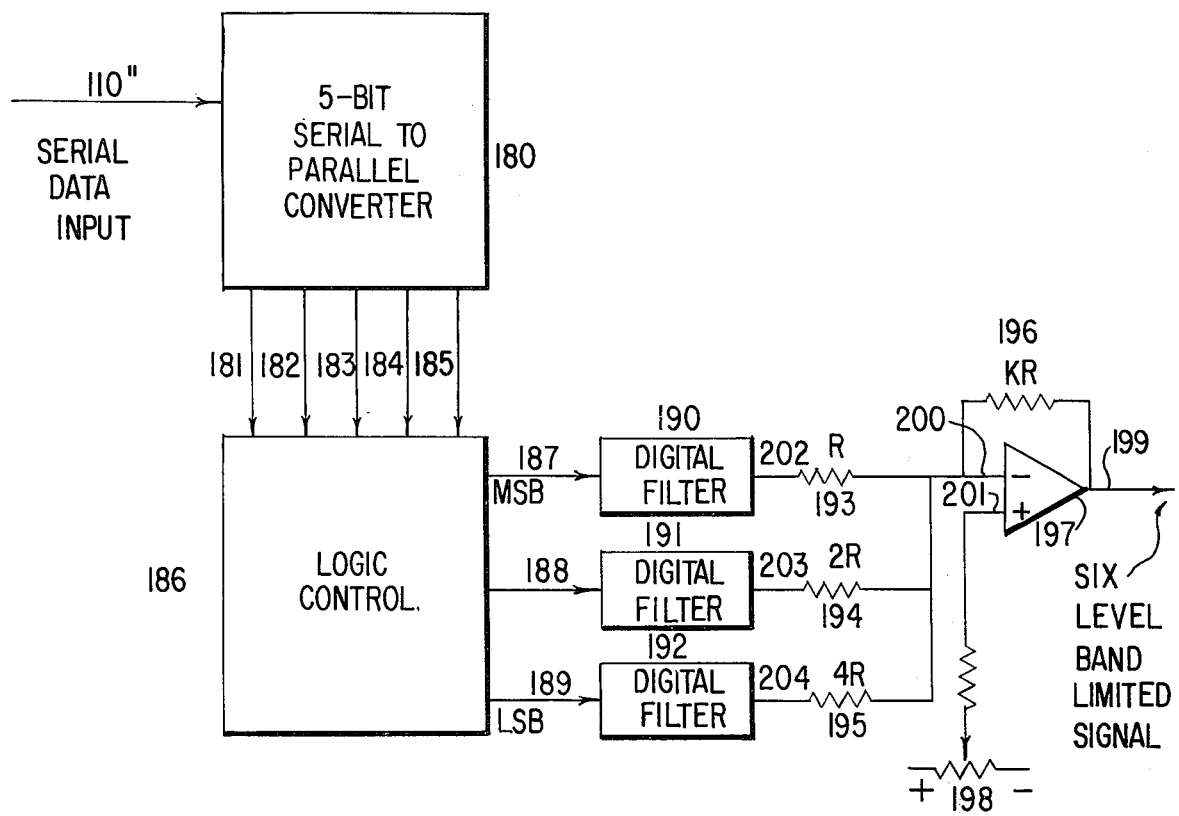
FIG. 9 is a schematic circuit diagram, largely in block form, of a six-level digital filter.

Referring to FIG. 9, a six-level digital filter is shown. In this case, a 5 bit binary word length was chosen to determine two six-level signals. The 5 binary bits will determine thirty-two discrete states. Two six-level signals require thirty-six discrete states, so that the selection of 5 binary bits requires that four of the thirty-six possible pairs of six-level signals be illegal.

As shown in FIG. 9, serial data is fed into a five bit serial to parallel converter 180 on line 110''. Converter 180 is a five bit expansion of the 3 bit serial to parallel converter shown in FIG. 3 and discussed above.

Referring to the truth table set forth below, correspondence between each five bit binary input, ABCDE, and a pair of six-level outputs $F_1G_1H_1$, $F_2G_2H_2$ is given. Output pairs (4, 0), (3, 0), (2, 5), (1, 5) are "illegal" as there is no 5 bit binary word to represent them. Thus, a pair of six-level signals can be derived from each 5 bit binary word input.

| INPUT | | 6-LEVEL OUTPUTS | | | |
|---|---|---|---|---|---|
| | | DECIMAL | | BINARY | |
| | | 1st 6-level output | 2nd 6-level output | 1st 6-level output $F_1G_1H_1$ | 2nd 6-level output $F_2G_2H_2$ |
| Decimal | Binary ABCDE | | | | |
| 0 | 00000 | 5 | 3 | 1 0 1 | 0 1 1 |
| 1 | 00001 | 5 | 4 | 1 0 1 | 1 0 0 |
| 2 | 00010 | 4 | 3 | 1 0 0 | 0 1 1 |
| 3 | 00011 | 4 | 4 | 1 0 0 | 1 0 0 |
| 4 | 00100 | 2 | 3 | 0 1 0 | 0 1 1 |
| 5 | 00101 | 2 | 4 | 0 1 0 | 1 0 0 |
| 6 | 00110 | 3 | 3 | 0 1 1 | 0 1 1 |
| 7 | 00111 | 3 | 4 | 0 1 1 | 1 0 0 |
| 8 | 01000 | 0 | 5 | 0 0 0 | 1 0 1 |
| 9 | 01001 | 5 | 5 | 1 0 1 | 1 0 1 |
| 10 | 01010 | 3 | 5 | 0 1 1 | 1 0 1 |
| 11 | 01011 | 4 | 5 | 1 0 0 | 1 0 1 |
| 12 | 01100 | 1 | 3 | 0 0 1 | 0 1 1 |
| 13 | 01101 | 1 | 4 | 0 0 1 | 1 0 0 |
| 14 | 01110 | 0 | 3 | 0 0 0 | 0 1 1 |
| 15 | 01111 | 0 | 4 | 0 0 0 | 1 0 0 |
| 16 | 10000 | 5 | 2 | 1 0 1 | 0 1 0 |
| 17 | 10001 | 5 | 1 | 1 0 1 | 0 0 1 |
| 18 | 10010 | 4 | 2 | 1 0 0 | 0 1 0 |
| 19 | 10011 | 4 | 1 | 1 0 0 | 0 0 1 |
| 20 | 10100 | 2 | 2 | 0 1 0 | 0 1 0 |
| 21 | 10101 | 2 | 1 | 0 1 0 | 0 0 1 |
| 22 | 10110 | 3 | 2 | 0 1 1 | 0 1 0 |
| 23 | 10111 | 3 | 1 | 0 1 1 | 0 0 1 |
| 24 | 11000 | 2 | 0 | 0 1 0 | 0 0 0 |
| 25 | 11001 | 1 | 0 | 0 0 1 | 0 0 0 |
| 26 | 11010 | 5 | 0 | 1 0 1 | 0 0 0 |
| 27 | 11011 | 0 | 0 | 0 0 0 | 0 0 0 |
| 28 | 11100 | 1 | 2 | 0 0 1 | 0 1 0 |
| 29 | 11101 | 1 | 1 | 0 0 1 | 0 0 1 |
| 30 | 11110 | 0 | 2 | 0 0 0 | 0 1 0 |
| 31 | 11111 | 0 | 1 | 0 0 0 | 0 0 1 |

The following Boolean equations define output pairs $F_1G_1H_1$ and $F_2G_2H_2$ in terms of the binary inputs A, B, C, D, and E:

$$F_1 = \overline{B} \cdot \overline{C} + \overline{A} \cdot B \cdot \overline{C} \cdot E + B \cdot \overline{C} \cdot D(A \oplus E)$$

$$F_2 = \overline{A} \cdot \overline{B} \cdot E + \overline{A} \cdot B \cdot \overline{C} + \overline{A} \cdot C \cdot E$$

$$G_1 = \overline{B} \cdot C + B \cdot \overline{C} \cdot \overline{E(A \oplus D)}$$

$$G_2 = \overline{E(\overline{A} \cdot \overline{B} + A \cdot C + \overline{B} \cdot \overline{C} + B \cdot C)}$$

$$H_1 = (D \oplus E)B \cdot \overline{C} + (B \oplus D)C + \overline{B} \cdot \overline{C} \cdot \overline{D}$$

$$H_2 = \overline{A} \cdot \overline{B} \cdot \overline{E} + \overline{A} \cdot B \cdot \overline{C} + A \cdot \overline{B} \cdot E + A \cdot C \cdot E$$

Figure 10:
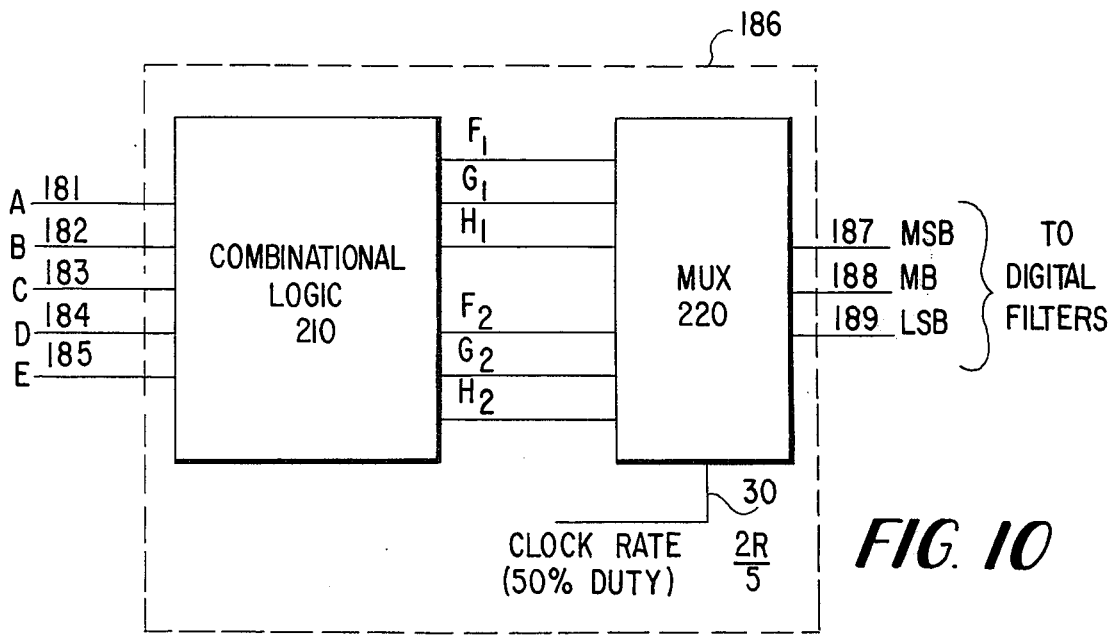
FIG. 10 is a schematic circuit diagram, largely in block form, of the control logic of FIG. 9.

Referring to FIG. 10, combinatorial logic represented by block 210 performs the function of realizing, logically, the abovementioned Boolean equations for output pairs $F_1G_1H_1$ and $F_2G_2H_2$. Combinatorial logic circuit 210 is comprised of conventional gates such as shown in FIG. 8 and those skilled in the art will appreciate that the specific design thereof follows directly from the Boolean equations given above.

Logic circuit 210 has as its input a 5 bit binary word, provided by the outputs 181 to 185 of the 5 bit serial to parallel converter 180 shown in FIG. 9, and produces a pair of 3 bit outputs, $(F_1G_1H_1)$, $(F_2G_2H_2)$, each representing a six-level signal. The two pairs of outputs $(F_1G_1H_1)$, $(F_2G_2H_2)$ are fed into a triple two line to one line multiplexer 220, whose outputs 187, 188, 189 alternate between $F_1G_1H_1$ and $F_2G_2H_2$, as clocked by clock 230 at a rate of 2R/5. Thus control logic circuit 186 performs the function of producing two six-level codes for each 5 bit binary word presented at its input. As discussed above, since the truth table described hereinabove represents an arbitrary choice, so does the implementing circuitry. The control logic 186 is designed to perform whatever transformations are desired and as discussed above in the eight-level digital filter, in some instances no such transformations are needed.

Returning to FIG. 9, the outputs 187, 188, 189 from control circuit 186 feed into digital filters 190, 191, 192 to achieve the desired time response. The outputs from the digital filters 202, 203, 204 are connected to summing resistors 193, 194, 195 with values R, 2R and 4R respectively. These resistors are each connected to the inverting input 200 of an operational amplifier 197. A feedback resistor 196, with value $k$R is connected from the output 199 of operational amplifier 197 to the inverting input 200. A potentiometer 198 is connected to the non-inverting input 201 of operational amplifier 197 and provides a voltage reference. Thus, a pair of six-level band-limited signals are produced at output 199 for every 5 bit word that serially enters the 5 bit serial to parallel converter 180 on input line 110''.

Figure 11:
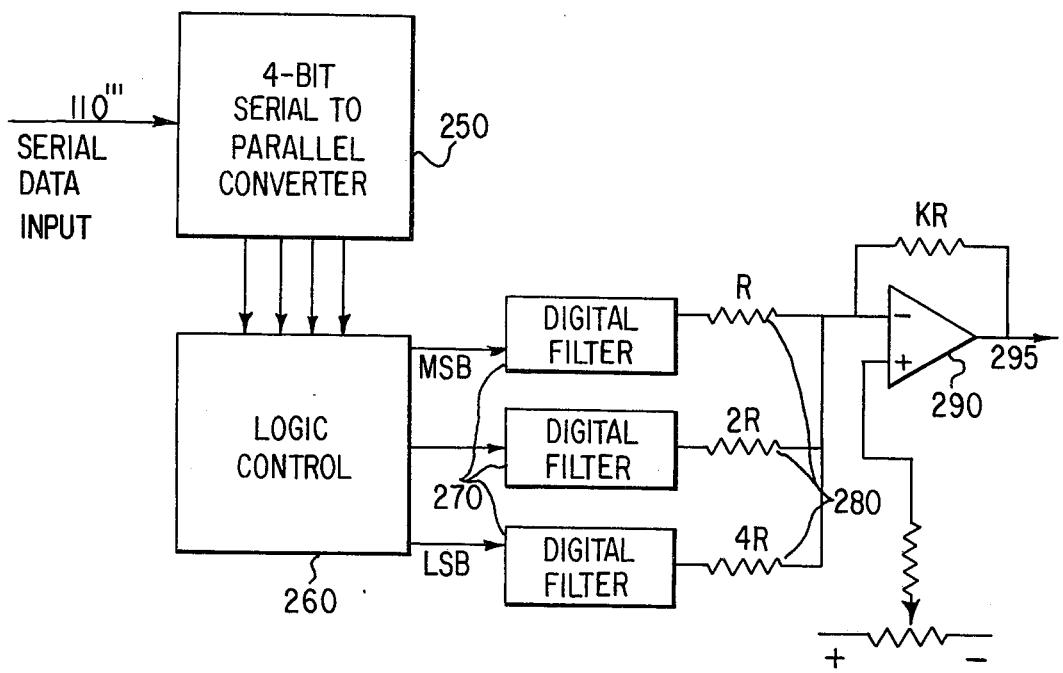
FIG. 11 is a schematic circuit diagram, largely in block form, of a five-level digital filter.

Referring now to FIG. 11, a five-level digital filter is shown. A 4 bit binary input word has been selected to produce pairs of five-level signals. Four binary bits will determine sixteen of the twenty-five possible pairs of five-level signals, so that nine pairs of five-level signals will be illegal. Similarly to the embodiments discussed above, serial input data is converted to 4 bit parallel data by converter 250. Logic control circuit 260 will produce a pair of five-level codes for each 4 bit word presented at its inputs. Digital filters 270 provide the desired time response and their outputs are summed through resistors 280 to form the input into an operational amplifier 290. The output 295 of operational amplifier 290 is a pair of band-limited five-level signals for each 4 bit binary word to enter converter 250 on input line 110'''.

Figure 12:
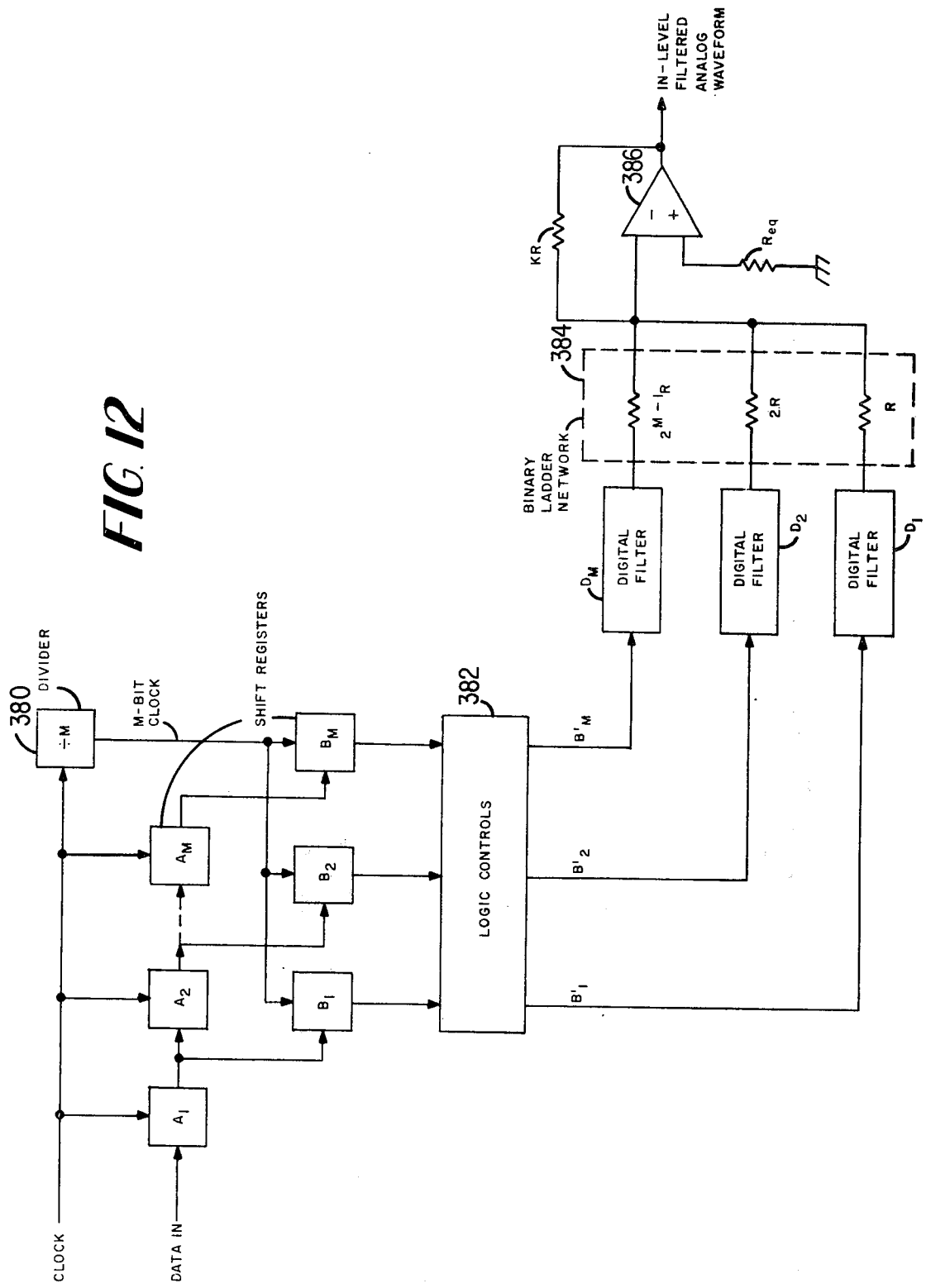
FIG. 12 is a schematic circuit diagram of an N-level digital filter system in accordance with a further embodiment of the invention.

Referring to FIG. 12, a generalized N-level digital filtering system is shown. In this system the incoming data is read serially into M shift-registers $A_1, A_2, \ldots, A_M$, wherein $M = \log_2 N$ and if M is a fraction it is rounded to the next higher integer. The data read into registers $A_1$ to $A_M$ is read out in parallel by a second series of shift registers $B_1, B_2, \ldots, B_M$ under the control of an M-bit clock produced by dividing the clock by M in a divider 380. A logic control circuit 382 transforms the parallel outputs of registers $B_1$ to $B_M$ into the desired parallel outputs $B'_1, B'_2, B'_M$ in a manner similar to that discussed hereinabove in connection with the specific exemplary embodiments previously considered. The logic circuit can be as simple as straight hard wired connections between inputs and outputs of control circuit 382 as illustrated by the aforementioned eight-level system. The input to the logic control circuit 382 can be "gray" coded, or any other desired code can be used to modify the data. In general the maximum number of levels that can be generated by using M digital filter is $2^M$. The number of levels generated would be less than $2^M$ if some of the combinations of M bits are inhibited by the logic control circuit 382. Each output of this logic control circuit 382 is filtered by one of M, binary input digital filters $D_1, D_2, \ldots, D_M$ as illustrated. The outputs of filters $D_1$ to $D_M$ are weighted by a binary weighted ladder resistor network 384 and summed to form the input to a summing amplifier 386. The relationship between the resistor values is indicated in FIG. 12, and a bias term is provided by summing amplifier 386 to make the output bipolar. As shown, the summing amplifier network includes a reference or equivalent resistor $R_{eq}$ and a feedback resistor $K$R. The arrangement of ladder network 384 and the operational amplifier 386 with feedback resistor $K$R and equivalent resistor $R_{eq}$ results in different gains for the digital filters $D1, D2, D3, \ldots, D_M$, namely, $-K, -K/2, -K/4, \ldots, -K/2 (M-1)$, respectively. $R_{eq}$ is equivalent to the parallel combination of all resistors in ladder network 384 and feedback resistor $k$R. Considering a numerical example, suppose eight levels are to be generated, with the result that $M = \log_2 8 = 3$. Let the outputs of D1, D2, D3 be $e1, e2, e3$ and their values be either +1 or −1 at the sampling instants, then the output of the operational amplifier 386, $e_o$, can be expressed as $e_o = -K (e1 + e2/2 + e3/4)$. The eight possible levels are shown in the following table:

| e1 | e2 | e3 | $-e0 = \left( e1 + \dfrac{e2}{2} + \dfrac{e3}{4} \right) K$ |
|---|---|---|---|
| 1 | 1 | 1 | +1.75K |
| 1 | 1 | −1 | +1.25K |
| 1 | −1 | 1 | + .75K |
| 1 | −1 | −1 | + .25K |
| −1 | 1 | 1 | − .25K |
| −1 | 1 | −1 | − .75K |
| −1 | −1 | 1 | −1.25K |
| −1 | −1 | −1 | −1.75K |

Thus the output of summing amplifier 386 is an N-level filtered analog signal.

Figure 13:
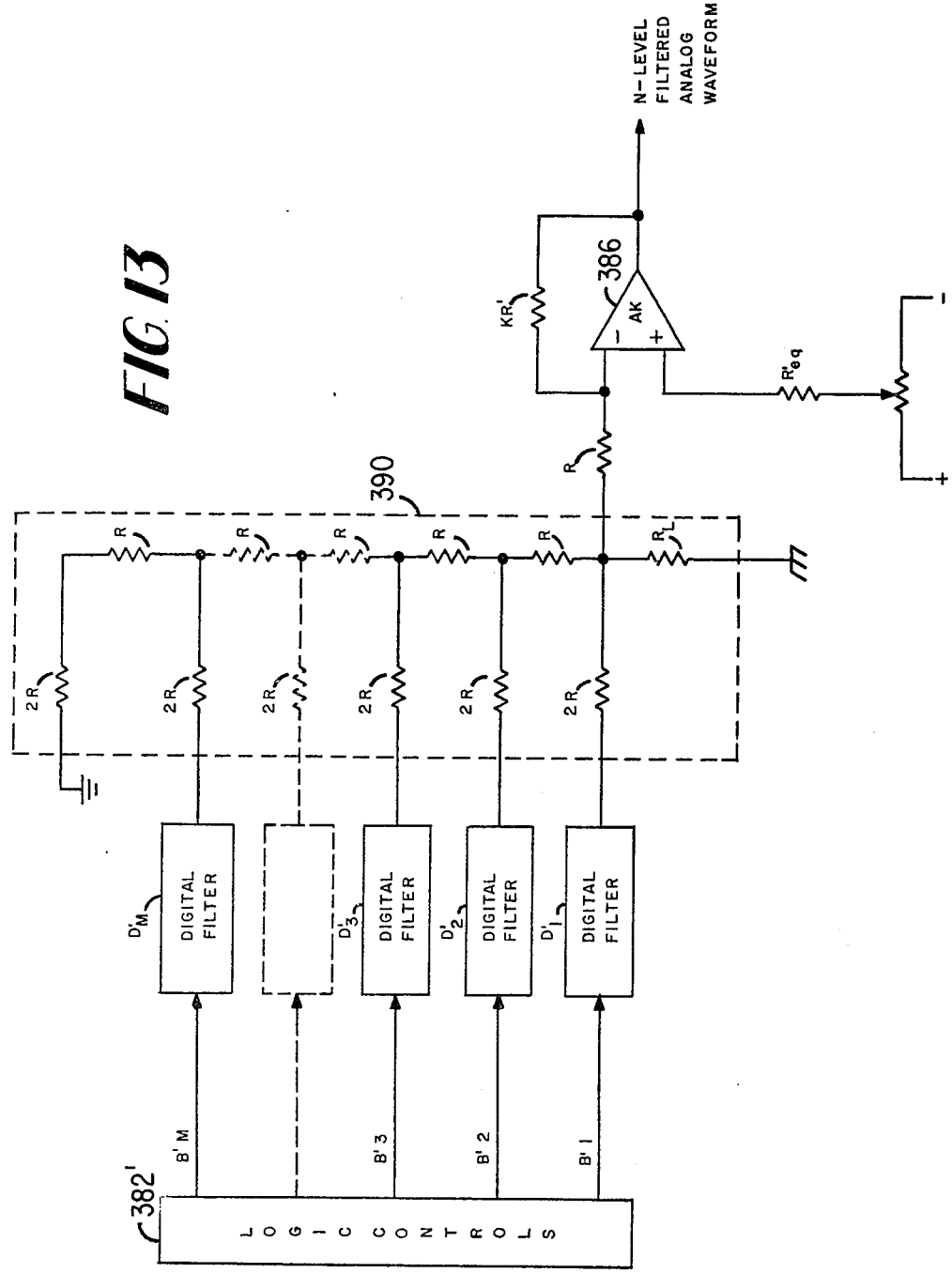
FIG. 13 is a schematic circuit diagram of an alternate embodiment of the N-level digital filter system of FIG. 4.

Referring to FIG. 13, a system similar to that of FIG. 12 is shown and like elements are given the same numbers with primes attached. The principal difference between the system of FIGS. 12 and 13 is that in the latter a conventional R–2R ladder network 390 replaces the binary ladder network of FIG. 12.

Figure 14:
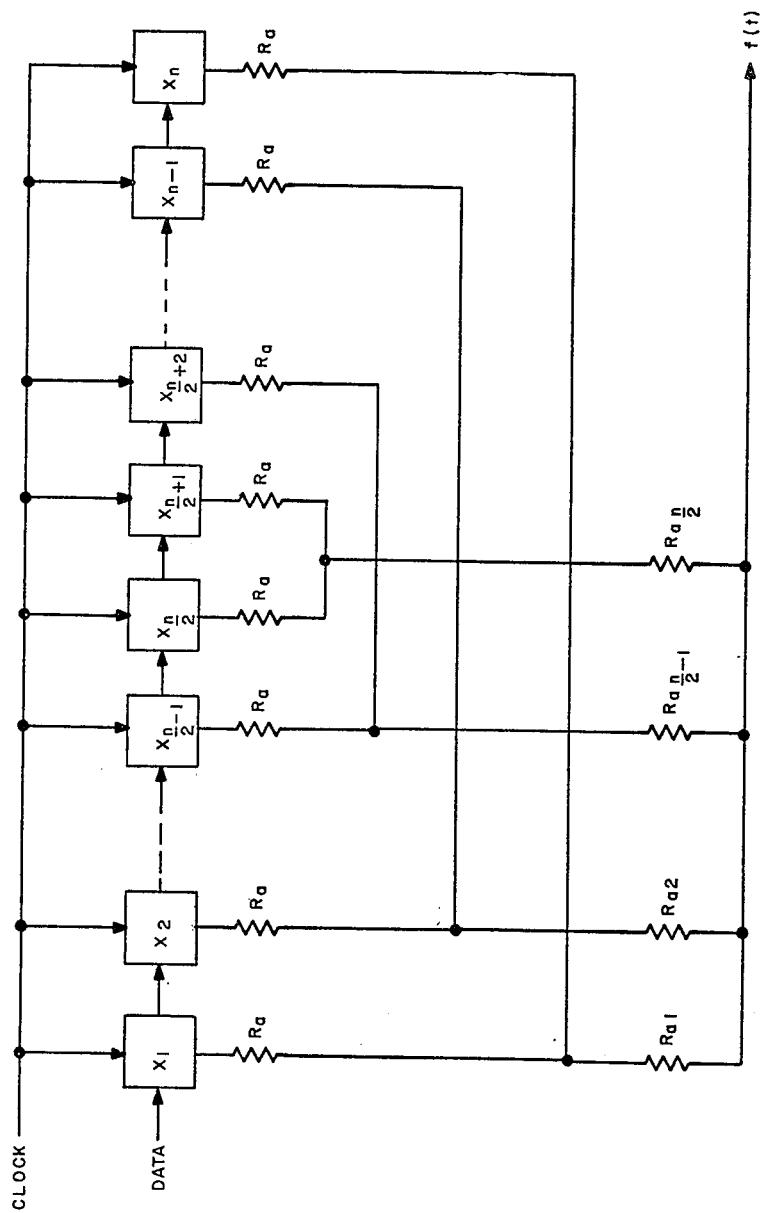
FIG. 14 is a schematic circuit diagram of an alternate embodiment of the digital shaping filter of FIG. 3.

Referring to FIG. 14, an alternate embodiment of the digital filter of FIG. 3 is shown. As illustrated, resistors $R_a$ are connected to the outputs of all of the registers $X_1$ to $X_n$ and the outputs of registers $X_1$ and $X_n$, $X_2$ and $X_{n-1}, \ldots,$ Xn/2 − 1 and Xn/2 + 2, and Xn/2 and Xn/2 + 1 are summed. These outputs are connected through resistors $R_{a1}, R_{a2}, \ldots, R_{an/2} - 1, R_{an/2}$ to form the desired $f(t)$ output.

Figure 15:
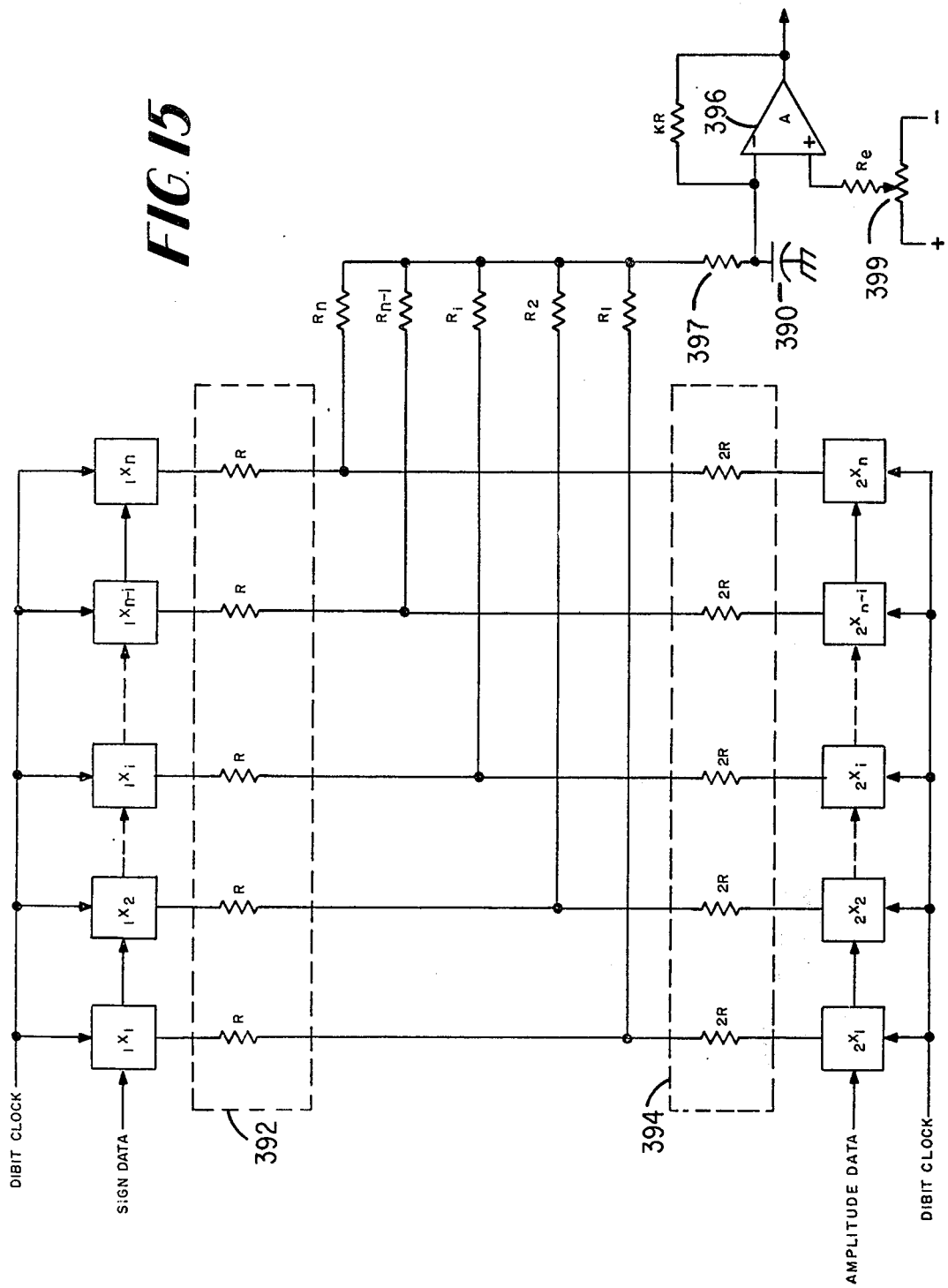
FIG. 15 is a schematic circuit diagram of an alternate embodiment of a four-level digital filter system of FIG. 1.

Finally, referring to FIG. 15, an alternate embodiment of the four-level digital filter arrangement of FIG. 1 is shown. The sign and amplitude data are separated as described hereinabove and a dibit clock, derived in the manner discussed above, controls the sampling times of first and second chains of registers $1X_1$ to $1X_n$ and $2X_1$ to $2X_n$. As illustrated, a first resistor network 392 is formed by resistors R individually connected to the outputs of registers $1X_1$ to $1X_n$ and a second resistor network 394 is formed by resistors 2R individually connected to the outputs of registers $2X_1$ to $2X_n$. The individual outputs of the networks are summed and are respectively connected through resistors $R_1, R_2, \ldots, R_i, \ldots, R_{n-1}, R_n$ to a common input to an operational amplifier 96 through a resistor 397. A capacitor 390 connects the input to ground and the circuit of operational amplifier 396 includes a feedback resistor KR and a reference or biasing input formed by potentiometer 399 and resistor Req. connected between the tap of potentiometer 399 and the noninverting input to operational amplifier 398. The values for the resistors in the example referred to above where N=128, $m$=16, and $r$=6 are given in the following table, negative resistances indicating that the outputs of the corresponding stages are inverted:

| | Resistor values | | Resistor values |
|---|---|---|---|
| $R_1$ | open | $R_{60}$ | 10.6K |
| $R_2$ | −1224.8K | $R_{61}$ | 9.9K |
| $R_3$ | −1333.5K | $R_{62}$ | 9.9K |
| $R_4$ | −1702.0K | $R_{63}$ | 10.6K |
| $R_5$ | −3032.9K | $R_{64}$ | 12.0K |
| $R_6$ | 1329.8K | $R_{65}$ | 14.7K |
| $R_7$ | 2394.5K | $R_{66}$ | 19.9K |
| $R_8$ | 1192.5K | $R_{67}$ | 32.1K |
| $R_9$ | 823.5K | $R_{68}$ | 77.3K |
| $R_{10}$ | 1529.2K | $R_{69}$ | −345.1K |
| $R_{11}$ | 1279.8K | $R_{70}$ | −65.8K |
| $R_{12}$ | 1355.5K | $R_{71}$ | −43.1K |
| $R_{13}$ | 1895.2K | $R_{72}$ | −37.4K |
| $R_{14}$ | 7836.9K | $R_{73}$ | −38.2K |
| $R_{15}$ | −2497.4K | $R_{74}$ | −47.0K |
| $R_{16}$ | −1031.6K | $R_{75}$ | −66.9K |
| $R_{17}$ | −680.7K | $R_{76}$ | −133.9K |
| $R_{18}$ | −384.3K | $R_{77}$ | −21475.6K |
| $R_{19}$ | −388.6K | $R_{78}$ | 158.4K |
| $R_{20}$ | −473.0K | $R_{79}$ | 92.0K |
| $R_{21}$ | −815.8K | $R_{80}$ | 75.6K |
| $R_{22}$ | 54882.3K | $R_{81}$ | 75.0K |
| $R_{23}$ | 680.4K | $R_{82}$ | 81.5K |
| $R_{24}$ | 342.8K | $R_{83}$ | 112.7K |
| $R_{25}$ | 234.2K | $R_{84}$ | 215.4K |
| $R_{26}$ | 250.8K | $R_{85}$ | 3462.7K |
| $R_{27}$ | 247.8K | $R_{86}$ | −281.6K |
| $R_{28}$ | 298.0K | $R_{87}$ | −156.4K |
| $R_{29}$ | 512.1K | $R_{88}$ | −125.7K |
| $R_{30}$ | −30835.6K | $R_{89}$ | −122.4K |
| $R_{31}$ | −428.9K | $R_{90}$ | −156.6K |
| $R_{32}$ | −218.2K | $R_{91}$ | −218.2K |
| $R_{33}$ | −156.6K | $R_{92}$ | −428.9K |
| $R_{34}$ | −122.4K | $R_{93}$ | −30835.6K |
| $R_{35}$ | −125.7K | $R_{94}$ | −512.1K |
| $R_{36}$ | −156.4K | $R_{95}$ | −298.0K |
| $R_{37}$ | −281.6K | $R_{96}$ | −247.8K |
| $R_{38}$ | −346.2K | $R_{97}$ | −250.8K |
| $R_{39}$ | −215.4K | $R_{98}$ | −243.2K |
| $R_{40}$ | −112.7K | $R_{99}$ | 342.8K |
| $R_{41}$ | −81.5K | $R_{100}$ | 680.4K |
| $R_{42}$ | −75.0K | $R_{101}$ | 54882.3K |
| $R_{43}$ | −75.6K | $R_{102}$ | −815.8K |
| $R_{44}$ | −92.0K | $R_{103}$ | −473.0K |
| $R_{45}$ | −158.4K | $R_{104}$ | −388.6K |
| $R_{46}$ | −21475.6K | $R_{105}$ | −384.3K |
| $R_{47}$ | −133.9K | $R_{106}$ | −680.7K |
| $R_{48}$ | −66.9K | $R_{107}$ | −1031.6K |
| $R_{49}$ | −47.0K | $R_{108}$ | −2497.4K |
| $R_{50}$ | −38.2K | $R_{109}$ | 7836.9K |
| $R_{51}$ | −37.4K | $R_{110}$ | 1895.2K |
| $R_{52}$ | −43.1K | $R_{111}$ | 1335.5K |
| $R_{53}$ | −65.8K | $R_{112}$ | 1279.8K |
| $R_{54}$ | −345.1K | $R_{113}$ | 1529.2K |
| $R_{55}$ | 77.3K | $R_{114}$ | 823.5K |
| $R_{56}$ | 32.1K | $R_{115}$ | 1192.5K |
| $R_{57}$ | 19.9K | $R_{116}$ | 2394.5K |
| $R_{58}$ | 14.7K | $R_{117}$ | 73298.1K |
| $R_{59}$ | 12.0K | | |

Although the invention has been described with respect to exemplary embodiments thereof, it will be understood that variations and modifications can be effected in these embodiments without departing from the scope and spirit of the invention.

We claim:

1. A multilevel digital filter system comprising a first set of shift registers, means including a clock for reading the incoming data serially into said first set of shift registers, means including a second set of shift registers connected to the outputs of said first set of shift registers for reading out the data stored in said first set of shift registers in parallel; logic control means for conditioning the parallel outputs of said second set of shift registers; a plurality of digital shaping filters individual to the outputs of said logic control means for shaping said logic control outputs into a predetermined time response and summing means for summing the outputs of said digital filters to produce a bandlimited multilevel signal.

2. A system as claimed in claim 1 wherein said digital filters each comprise a chain of shift registers and resistor means for weighting the outputs of said shift registers.

3. A system as claimed in claim 2 wherein said resistor means comprises a resistor ladder network for weighting and summing the outputs of the chain of shift registers such as to force the time response to be the inverse Fourier transform of an ideal lowpass filter.

4. A system as claimed in claim 3 wherein the number, $n$, of shift registers in said chain of shift registers is given by the expression $n = r(m-1) + 2$ wherein $r$ is the ratio of the clock frequency to the data rate and $m$ is the number of pulses which can be accommodated within the truncated period determined by the digital filter.

5. A system as claimed in claim 1 wherein the number, M, of digital shaping filters is given by the expression $M = \log_2 N$ where N is the number of levels.

6. A system as claimed in claim 5 wherein said means for reading out the data in said first registers further comprises an M-bit clock connected to each shift register of said second set of shift registers.

7. A three-level digital filter system comprising a first set of shift registers, means including a clock for reading the incoming data serially into said first set of shift registers, means including a second set of shift registers connected to the outputs of said first set of shift registers for reading out the data stored in said first set of shift registers in parallel; logic control means for conditioning the parallel outputs of said second set of shift registers; two digital shaping filters individual to the outputs of said logic control means for shaping said logic control outputs into a predetermined time response and summing means for summing the outputs of digital filters to produce a bandlimited three-level signal.

8. An N-level digital filter system, where N=5, 6, or 8, said system comprising a first set of shift registers, means including a clock for reading the incoming data serially into said first set of shift registers; means including a second set of shift registers connected to the outputs of said first set of shift registers for reading out the data stored in said first set of shift registers in parallel; logic control means for conditioning the parallel outputs of said second set of shift registers; three digital shaping filters individual to the outputs of said logic control means for shaping said logic control outputs into a predetermined time response and summing means for summing the outputs of digital filters to produce a bandlimited N-level signal.

9. An N-level digital filter system as claimed in claim 8, wherein N=8 and said logic control means comprises three direct connections between said logic control inputs and said three digital filters.

* * * * *